(12) United States Patent
Takeuchi (10) Patent No.: US 9,599,911 B2
(45) Date of Patent: Mar. 21, 2017

(54) TEMPERATURE ADJUSTING APPARATUS OF MASK SUBSTRATE, MASK DRAWING APPARATUS, AND MASK DRAWING METHOD

(71) Applicant: NuFlare Technology, Inc., Yokohama-shi (JP)

(72) Inventor: Hiroki Takeuchi, Kawaguchi (JP)

(73) Assignee: NuFlare Technology, Inc., Yokohama-shi (JP)

( * ) Notice: Subject to any disclaimer, the term of this patent is extended or adjusted under 35 U.S.C. 154(b) by 237 days.

(21) Appl. No.: 14/288,727

(22) Filed: May 28, 2014

(65) Prior Publication Data

US 2014/0362353 A1    Dec. 11, 2014

(30) Foreign Application Priority Data

Jun. 6, 2013    (JP) ................................. 2013-119523

(51) Int. Cl.

| G03B 27/32 | (2006.01) |
| G03B 27/52 | (2006.01) |
| G03B 27/58 | (2006.01) |
| G03B 27/62 | (2006.01) |
| G03F 7/20  | (2006.01) |
| G03F 1/68  | (2012.01) |

(52) U.S. Cl.
CPC ............ *G03F 7/70875* (2013.01); *G03F 1/68* (2013.01); *G03F 7/2063* (2013.01)

(58) Field of Classification Search
CPC ........ G03F 1/0092; G03F 1/68; G03F 7/2059; G03F 7/2063; G03F 7/70741; G03F 7/70875

USPC .............................. 355/30, 72, 75, 77; 430/5
See application file for complete search history.

(56) References Cited

U.S. PATENT DOCUMENTS

| 6,342,941 B1 * | 1/2002 | Nei ...................... G03F 7/70433 355/52 |
| 2001/0003013 A1 * | 6/2001 | Katsumata .......... G03F 7/70875 427/555 |
| 2005/0167514 A1 * | 8/2005 | Kaushal .................. G03F 1/144 236/1 C |
| 2010/0053575 A1 * | 3/2010 | Huang ................ G03F 7/70875 355/30 |
| 2012/0120379 A1 * | 5/2012 | Phillips ..................... F28F 3/12 355/52 |
| 2015/0212432 A1 * | 7/2015 | Onvlee ................... G03F 7/708 355/30 |

FOREIGN PATENT DOCUMENTS

JP    4005938    11/2007

* cited by examiner

*Primary Examiner* — Colin Kreutzer
(74) *Attorney, Agent, or Firm* — Oblon, McClelland, Maier & Neustadt, L.L.P.

(57) ABSTRACT

A temperature adjusting apparatus of a mask substrate according to an embodiment is used in a mask drawing apparatus drawing a desired pattern by irradiating a charged particle beam to a mask substrate after a temperature of the mask substrate is adjusted in advance. The temperature adjusting apparatus includes a supporting member supporting the mask substrate; and first and second temperature adjusting plates facing each other with sandwiching the supporting member, the plates having a plurality of first and second regions respectively, and each temperatures of the first and second regions being capable to be independently adjusted.

22 Claims, 5 Drawing Sheets

TEMPERATURE ADJUSTING APPARATUS OF MASK SUBSTRATE, MASK DRAWING APPARATUS, AND MASK DRAWING METHOD

CROSS REFERENCE TO RELATED APPLICATION

This application is based upon and claims the benefit of priority from Japanese Patent Application No. 2013-119523, filed on Jun. 6, 2013; the entire contents of which are incorporated herein by reference.

FIELD

Embodiments described herein relate generally to a temperature adjusting apparatus of a mask substrate used in a mask drawing apparatus which draws a desired pattern by irradiating a charged particle beam to a mask substrate whose temperature is adjusted in advance, the mask drawing apparatus, and a mask drawing method.

BACKGROUND

When a temperature of a mask substrate is not uniform, a distortion occurs in the mask substrate due to thermal expansion or thermal contraction. Thereby, a drawing accuracy to the mask substrate is reduced. Thus, in a conventional mask drawing apparatus, it is suggested to keep a mask substrate at a constant temperature in advance before a desired pattern is drawn by irradiation of a charged particle beam to the mask substrate.

Further, in a mask drawing apparatus, it is suggested to actively temperature-control a temperature adjusting plate which controls a temperature of a mask substrate based on a detection output of a temperature sensor so that the temperature of the temperature adjusting plate is made stable faster than in a case of being controlled to be constant.

However, larger heat is released from a support pin supporting a mask substrate W or a peripheral portion of the mask substrate W. Further, when a charged particle beam is irradiated, a temperature of an irradiation region is raised by energy of the charged particle beam. A conventional temperature adjusting apparatus is configured that a temperature of a mask substrate W becomes uniform at a time of temperature adjustment. Thus, even if the temperature of the mask substrate W is uniform in a temperature adjusting chamber, there is a possibility that the temperature of the mask substrate W at a time of drawing in a writing chamber is not uniform.

DETAILED DESCRIPTION

A temperature adjusting apparatus of a mask substrate according to an embodiment is used in a mask drawing apparatus drawing a desired pattern by irradiating a charged particle beam to a mask substrate after a temperature of the mask substrate is adjusted in advance. The temperature adjusting apparatus includes a supporting member supporting the mask substrate; and first and second temperature adjusting plates facing each other with sandwiching the supporting member, the plates having a plurality of first and second regions respectively, and each temperatures of the first and second regions being capable to be independently adjusted.

Embodiment

Hereinafter, an embodiment of the present invention will be described in detail with reference to the drawings.

Figure 1A:
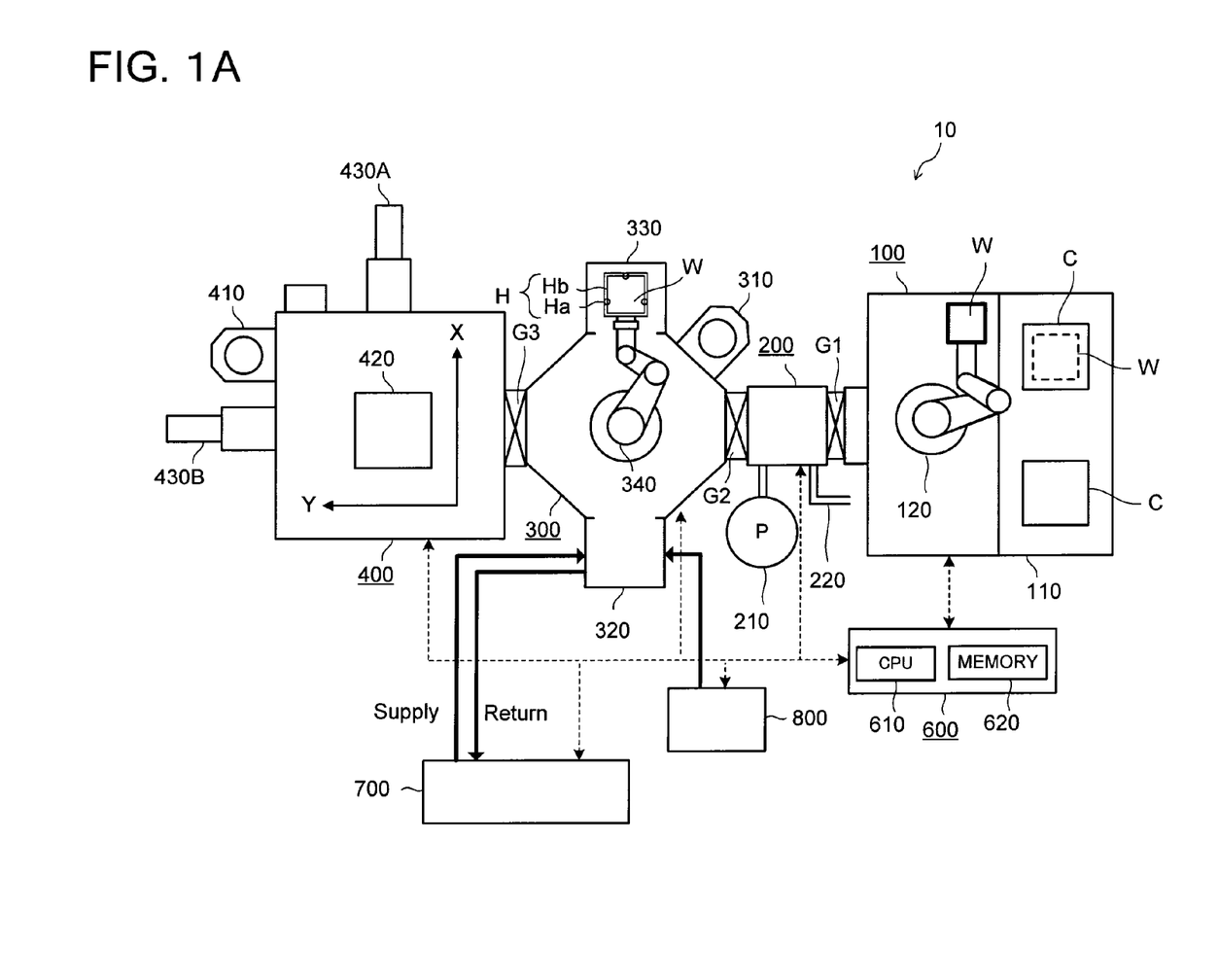
FIG. 1A and FIG. 1B are schematic diagrams of a mask drawing apparatus according to an embodiment.
Figure 1B:
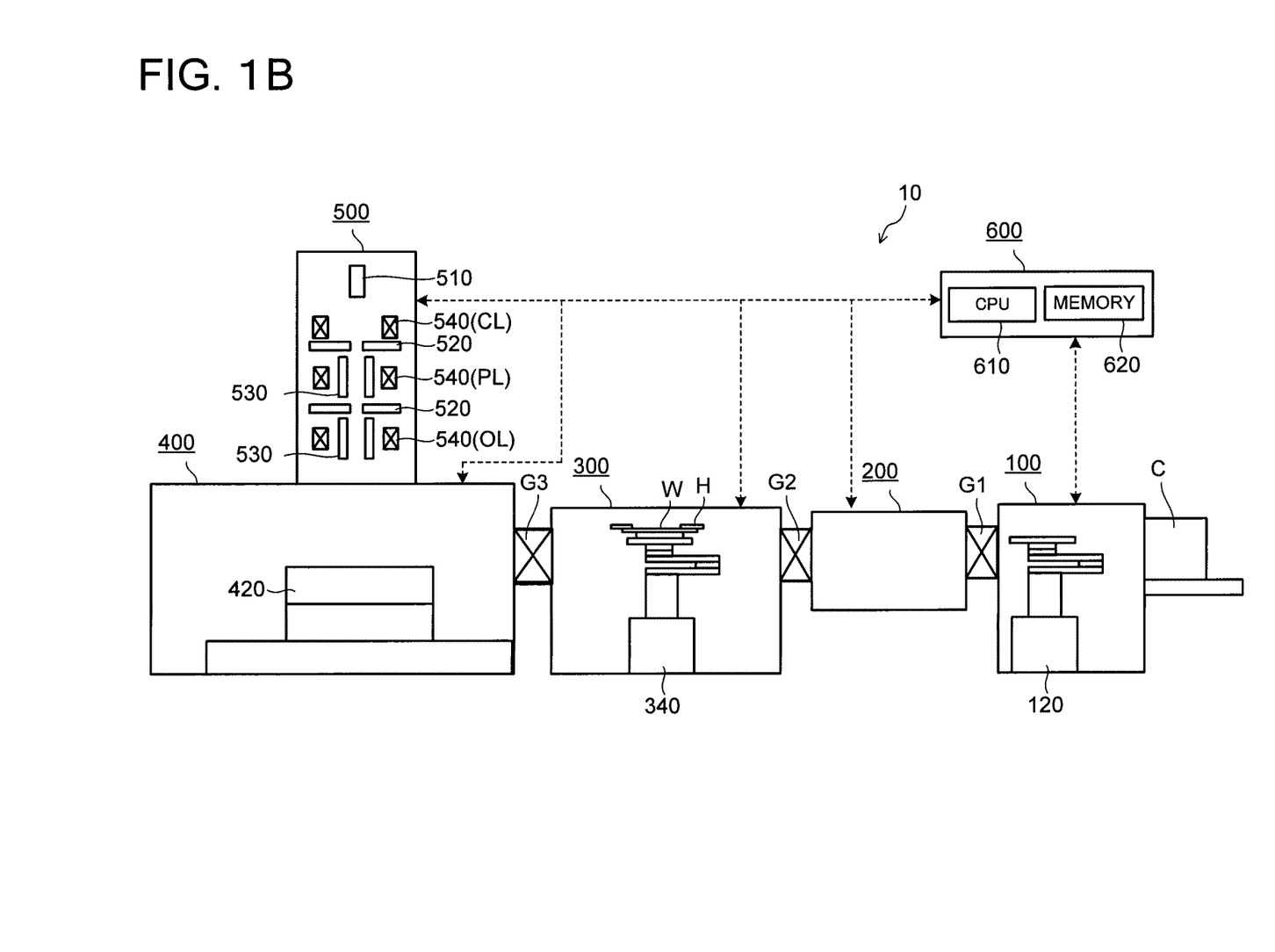

FIG. 1A and FIG. 1B are schematic diagrams of a mask drawing apparatus 10 according to the embodiment. FIG. 1A is a plan view of the mask drawing apparatus 10. FIG. 1B is a cross-sectional view of the mask drawing apparatus 10. Hereinafter, a configuration of the mask drawing apparatus 10 will be described with reference to FIG. 1A and FIG. 1B. Note that in FIG. 1A a charged particle beam lens barrel 500 is not shown.

As shown in FIG. 1A and FIG. 1B, the mask drawing apparatus 10 has an interface (I/F) 100, an input/output (I/O) chamber 200, a robot chamber (R chamber) 300, a writing chamber 400, the charged particle beam lens barrel 500, a control device 600, a heat exchanger 700, a power supply 800, and gate valves G1 to G3. Note that the robot chamber (R chamber) 300 constitutes a carrier chamber.

The I/F 100 has a mounting table 110 and a carrier robot 120. On the mounting table 110 is mounted a container C (for example, SMIFPod) housing a mask substrate W where a light shielding film (for example, chromium (Cr)) and a resist film are stacked on a glass substrate. The carrier robot 120 carries the mask substrate W.

The I/O chamber 200 is what is called a load lock chamber for carrying in/out the mask substrate W while keeping the inside of the R chamber 300 vacuum (low pressure). The I/O chamber 200 is provided with the gate valve G1 between the IF 100 and the I/O chamber 200 and has a vacuum pump 210 and a gas supply series 220. The vacuum pump 210 is, for example, a dry pump, a turbo molecular pump, or the like, which evacuates the inside of the I/O chamber 200. The gas supply series 220 supplies vent gas (for example, nitrogen gas or CDA) to the inside of the I/O chamber 200 when making a pressure of the I/O chamber 200 an atmospheric pressure.

When the inside of the I/O chamber is to be evacuated, the vacuum pump 210 connected to the I/O chamber 200 is used for evacuation. Further, when the pressure of the inside of the I/O chamber is made to return to the atmospheric pressure, vent gas is supplied from the gas supply series 220 and the pressure of the inside of the I/O chamber 200 becomes the atmospheric pressure. When the inside of the I/O chamber 200 is evacuated and the pressure is made the atmospheric pressure, the gate valves G1, G2 are closed.

The R chamber 300 (first chamber) has a vacuum pump 310, a soaking chamber 320, an alignment chamber 330, and a carrier robot 340. The R chamber 300 is connected to the I/O chamber 200 via the gate valve G2.

The vacuum pump 310 is, for example, a Cryo pump, a turbo molecular pump, or the like. The vacuum pump 310 is connected to the R chamber 300 and evacuates the inside of the R chamber 300 to keep high vacuum.

Figure 2:
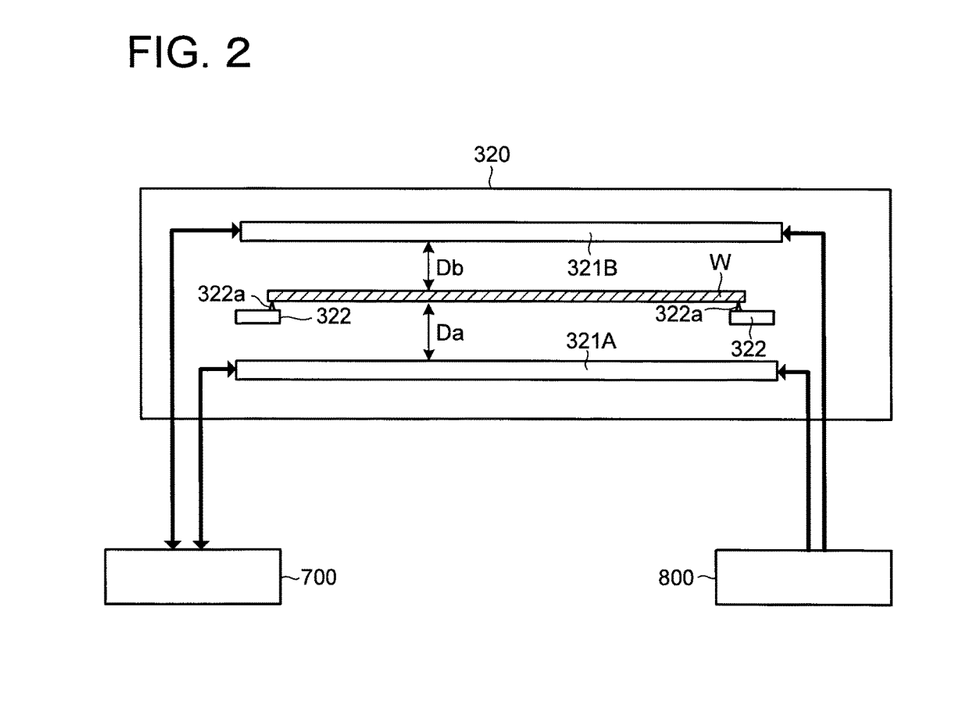
FIG. 2 is a schematic diagram of the inside of a soaking chamber according to the embodiment.

FIG. 2 is a schematic diagram of the inside of the soaking chamber (temperature adjusting chamber) 320. First and second temperature adjusting plates 321A, 321B disposed to face each other and a supporting member 322 which supports a mask substrate W are provided inside the soaking chamber 320. The supporting member 322 is provided with a pin 322a, and the mask substrate W is mounted on the pin 322a.

The first and second temperature adjusting plates 321A, 321B are disposed to vertically sandwich the mask substrate W (supporting member 322), and are larger than the mask substrate W. Further, the first and second temperature adjusting plates 321A, 321B are connected to the heat exchanger 700 and the power supply 800. As shown in FIG. 2, the mask substrate W is disposed, in the soaking chamber 320, between the first and second temperature adjusting plates 321A, 321B, and is adjusted to have an intentional temperature gradient for cancelling the temperature non-uniformity on the mask substrate W during drawing.

Figure 3A:
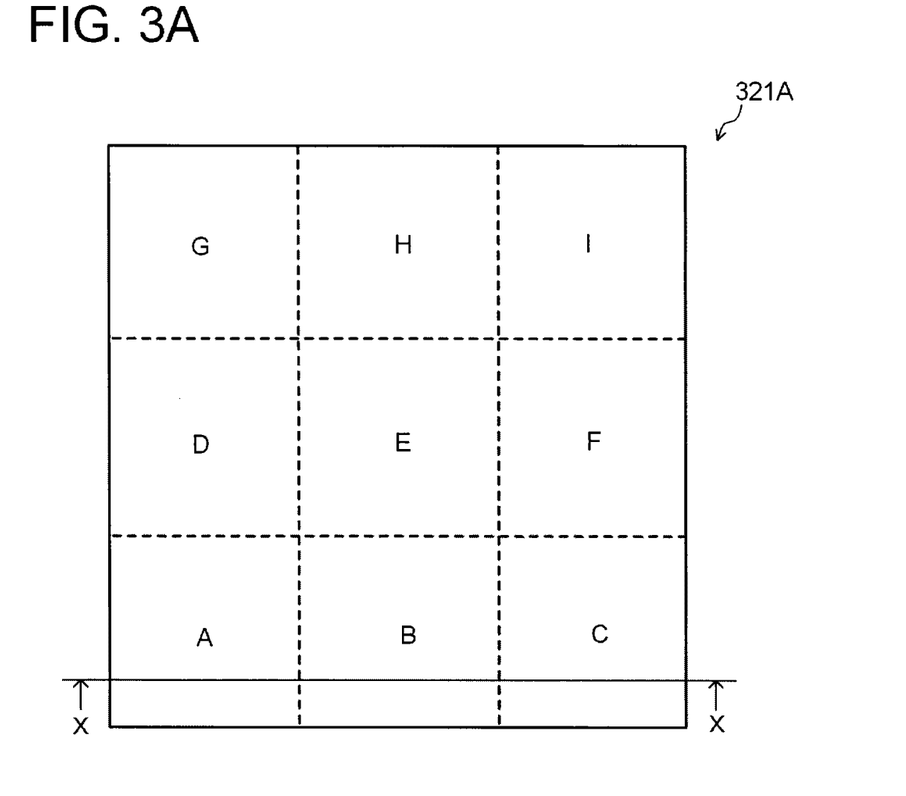
FIG. 3A and FIG. 3B are schematic diagrams of a temperature adjusting plate according to the embodiment.
Figure 3B:
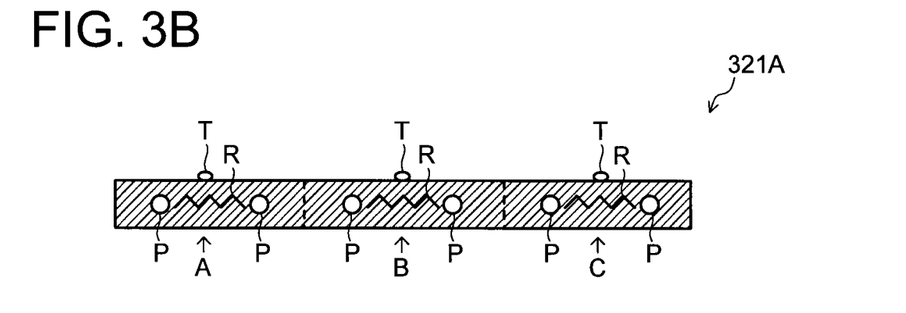

FIG. 3A and FIG. 3B are schematic diagrams of the first temperature adjusting plate 321A. FIG. 3A is a plan view of the first temperature adjusting plate 321A. FIG. 3B is a cross-sectional view taken along a line X-X in FIG. 3A. In FIG. 3A and FIG. 3B, respective regions A to I are indicated by chained lines. Hereinafter, a configuration of the first temperature adjusting plate 321A will be described with reference to FIG. 3A and FIG. 3B. Note that a configuration of the second temperature adjusting plate 321B is the same as the configuration of the first temperature adjusting plate 321A, and redundant explanation will be omitted.

The first temperature adjusting plate 321A is segmented into a plurality of areas (regions) A to I respectively. Areas A to I are each provided with a thermometer T. A temperature detected by each thermometer T is outputted to the control device 600. Further, the areas A to I are each connected to the heat exchanger 700 and the power supply 800.

Areas A to I are each provided with a pipe P for circulating cooling water from the heat exchanger 700 and a heater (register) R heated by power supplied from the power supply 800. The first and second temperature adjusting plates 321A, 321B are preferable to be constituted by a material (for example, a metal material) with a high heat conductivity.

The thermometer T is preferable to be a thermometer made of a platinum resister having a temperature measuring resolution of 0.001° C. or less. Note that since the configuration of the second temperature adjusting plate 321B is the same as the configuration of the first temperature adjusting plate 321A, redundant explanation will be omitted. Though respective thermometers T are disposed on surfaces of the first and second temperature adjusting plates 321A, 321B in FIG. 3B, the respective thermometers T can be embedded in the first and second temperature adjusting plates 321A, 321B.

Further, though the first and second temperature adjusting plates 321A, 321B are segmented into nine regions A to I in FIG. 3A and FIG. 3B, the number of the segmented regions is not limited to nine. For example, the first and second temperature adjusting plates 321A, 321B can be segmented into two or more to eight or less regions, or into ten or more regions. However, as described later, the first and second temperature adjusting plates 321A, 321B are preferable to coincide with each other in terms of the number and disposition of the segmented regions.

Here, heat release from the support pin supporting the mask substrate W and a peripheral portion of the mask substrate W is larger than in the other region. Further, after transfer to the writing chamber 400, heat release occurs also from an X-Y stage 420. Thus, even if a temperature of the mask substrate W is kept uniform inside the soaking chamber 320, the temperature of the mask substrate W is not necessarily uniform at a time that the mask substrate W is carried to the writing chamber 400.

Thus, in the mask drawing device 10, by segmenting the first and second temperature adjusting plates 321A, 321B into the plural areas A to I to control the temperature independently per area A to I, the temperature of the mask substrate W at a time of drawing is made uniform. In other words, by making the mask substrate W have a temperature gradient at a time of temperature adjustment in the soaking chamber 320, the temperature of the mask substrate W at a time of being carried to the X-Y stage 420 in the writing chamber 400 is made uniform. Note that the areas A to I of the first temperature adjusting plates 321A correspond to a plurality of first regions, and that the areas A to I of the second temperature plate 321B correspond to a plurality of second regions.

The first and second temperature adjusting plates 321A, 321B do not contact the mask substrate W directly, and heat the mask substrate W mainly by an infrared ray from above and below the mask substrate W.

Here, in order to make a temperature distribution of the mask substrate W reflect respective temperature distributions (temperatures of areas A to I) of the first and second temperature adjusting plates 321A, 321B, it is preferable that conditions (1) to (6) below are fulfilled.

(1) It is preferable that a pair of areas A to I (plural first regions and plural second regions) of the first and second temperature adjusting plates 321A, 321B are each disposed to face each other. For example, if the area A of the first temperature adjusting plate 321A faces the area I of the temperature adjusting plate 321B, it becomes difficult to adjust a temperature of the area of the mask substrate W disposed therebetween. Note that in this case the temperatures of the pair of areas A to I facing each other correspond to each other.

In view of the above, it is preferable that the number and disposition of the segmented regions in the first and second temperature adjusting plates 321A, 321B coincide with each other.

(2) It is preferable that the first and second temperature adjusting plates 321A, 321B and the mask substrate W are disposed almost in parallel to one another. If a parallel relationship is broken, influences given to the temperature distribution of the mask substrate W differ by the first and second temperature adjusting plates 321A, 321B or their areas, and it becomes difficult to adjust the temperature distribution of the mask substrate W.

(3) It is preferable that the pair of areas A to I of the first and second temperature adjusting plates 321A, 321B has the same shape and the same size. For example, if the area C of the first temperature adjusting plate 321A is different from the area C of the second temperature adjusting plate 321B in shape or size, it becomes difficult to adjust the temperature of the area of the mask substrate W disposed therebetween.

Note that when the conditions (1) to (3) are fulfilled, being viewed from above the first temperature adjusting plate 321A, the areas A to I of the temperature adjusting plate 321A almost overlap (boundaries almost coincide with each other) the areas A to I of the second temperature adjusting plate 321B.

(4) It is preferable that distances Da, Db of the first and second temperature adjusting plates 321A, 321B to the mask substrate W are small in some degree. If the distances Da, Db are too large, it becomes hard that the temperature distribution of the mask substrate W reflects the temperature distributions of the first and second temperature adjusting plates 321A, 321B. It is more preferable for the temperature adjustment that the distances Da, Db are smaller unless the mask substrate W comes into contact with the first and second temperature adjusting plates 321A, 321B. However, the distances Da, Db need to be larger than the width in which the thermometer T and a hand of the carrier robot 120 can enter.

(5) It is preferable that these distances Da, Db are almost equal. If these distances are different from each other, it becomes difficult to control the temperature distribution of the mask substrate W. However, when temperatures of the front and the back of the mask substrate W are to be differentiated, for example, the distances Da, Db can be different.

(6) It is preferable that a temperature difference between the pair of areas A to I of the first and second temperature adjusting plates 321A, 321B is small. However, when the temperatures of the front and the back of the mask substrate W are to be differentiated, for example, the temperatures of the areas A to I of the first temperature adjusting plate 321A and the second temperature adjusting plate 321B can be different from each other.

However, it is not necessarily required that all the conditions (1) to (6) are fulfilled. The numbers and disposition of the segmented regions in the first and second temperature adjusting plates 321A, 321B can be different as long as a correspondence exists between the respective temperature distributions of the first temperature adjusting plate 321A and the second temperature adjusting plate 321B. In other words, it is possible that the plural areas of the first and second temperature adjusting plates 321A, 321B do not have a one-to-one relationship. For example, it is possible to make the plural area of the second temperature adjusting plate 321B correspond to the one area of first temperature adjusting plate 321A, to make the temperatures thereof coincide.

In order to make the temperature of the mask substrate W at the time of drawing uniform, in this embodiment, a temperature measuring mask capable of measuring a temperature is used to measure in advance the temperatures of the respective areas A to I of the first and second temperature adjusting plates 321A, 321B by which the temperature of the mask substrate W becomes uniform when being carried to the X-Y stage 420 of the writing chamber, and the temperatures are stored in a memory 620 of the control device 600, which will be described later.

Then, as a result of controlling the temperatures of the respective areas A to I of the first and second temperature adjusting plates 321A, 321B to the temperatures stored in the memory 620 of the control device 600, the temperature of the mask substrate W becomes uniform when the mask substrate W is carried to the X-Y stage 420 of the writing chamber 400. In other words, in this embodiment, by making the temperature of the mask substrate W at the time of temperature adjustment have the temperature gradient consciously, the temperature of the mask substrate W is made uniform at the time of drawing.

When a charged particle beam is irradiated to a mask substrate W, a temperature of an irradiation area rises. Thus, it is considered that a temperature gradient occurs in the mask substrate W in correspondence with a drawing pattern to the mask substrate W.

In order to suppress occurrence of the temperature gradient in the mask substrate W due to such irradiation of the charged particle beam, it is possible to control the temperatures of the respective regions A to I of the first and second temperature adjusting plates 321A, 321B in correspondence with a pattern density of the mask substrate W or an irradiation amount of the charged particle beam corresponding to the respective regions A to I of the first and second temperature adjusting plates 321A, 321B, for example.

When the temperatures of the respective regions A to I are controlled in correspondence with the drawing pattern density or the irradiation amount of the charged particle beam to the mask substrate W, temperature distribution data of the mask substrate W according to differences of the drawing pattern density or the irradiation amount of the charged particle beam is obtained in advance and preset temperatures of the respective regions A to I are changed based on the temperature distribution data. Concretely, as a result that the preset temperature is lowered for the region in which the pattern density is high or the region in which the irradiation amount of the charged particle beam is large and that the preset temperature is raised for the region in which the pattern density is low or the region in which the irradiation amount of the charged particle beam is small, an influence by the irradiation of the charged particle beam can be suppressed.

The alignment chamber 330 is a chamber for aligning the mask substrate W. Further, the alignment chamber 330 houses a grounding body H. The grounding body H has, for example, a plurality of (for example, three) grounding pins Ha and a frame body Hb of a frame shape.

While the grounding body H is in a state of being mounted on the mask substrate W, drawing onto the mask substrate W by the charged particle beam is carried out. On this occasion, the grounding body H is connected to a not-shown ground. In other words, the grounding body H prevents accumulation (charging) of a charge to the mask substrate W by irradiation of the charged particle beam. The carrier robot 340 carries the mask substrate W between the I/O chamber 200, the soaking chamber 320, the alignment chamber 330, and the writing chamber 400. The carrier robot 340 functions as a carrier mechanism carrying the mask substrate W from the R chamber 300 (first chamber) to the writing chamber 400 (second chamber).

The writing chamber 400 (second chamber) has a vacuum pump 410, the X-Y stage 420, and drive mechanisms 430A, 430B, and is connected to the R chamber 300 via the gate valve G3.

The vacuum pump 410 is, for example, a Cryo pump, a turbo molecular pump, or the like. The vacuum pump 410 is connected to the writing chamber 400 and evacuates the inside of the writing chamber 400 to keep high vacuum. The X-Y stage 420 is a platform for mounting the mask substrate W thereon. The drive mechanism 430A drives the X-Y stage 420 in an X direction. The drive mechanism 430B drives the X-Y stage 420 in a Y direction.

The charged particle beam lens barrel 500 has a charged particle beam irradiation means constituted by an electron gun 510, an aperture 520, a polarizer 530, lenses 540 (illumination lens (CL), projection lens (PL), objective lens (OL)), and so on, and irradiates a charged particle beam to the mask substrate W mounted on the X-Y stage 420. A combination of the charged particle beam lens barrel 500 and the X-Y stage 420 functions as a drawing mechanism drawing a desired pattern by irradiating the charged particle beam to the mask substrate W.

The control device 600 is, for example, a computer or the like, and has a CPU 610 and the memory 620. The control device 600 controls the mask drawing device 10. The control device 600 controls the heat exchanger 700 and the power supply 800 in correspondence with temperatures outputted from the thermometers T of the first and second temperature adjusting plates 321A, 321B, for example. In other words, the control device 600 functions as a temperature adjusting mechanism adjusting the temperatures of the areas A to I of the first and second temperature adjusting plates 321A, 321B.

Concretely, a temperature of cooling water supplied from the heat exchanger 700 to the soaking chamber 320 and power supplied from the power supply 800 to the heater R are controlled so that the temperatures of the respective areas A to I of the first and second temperature adjusting plates 321A, 321B become temperatures (preset temperatures) set (stored) in advance in the memory 620. Note that generally the preset temperatures of the areas A to I are different from one another. At least any one of the preset temperatures of the areas A to I is different from the other preset temperatures.

In the memory 620 are stored, by using the temperature measuring mask as already described, the temperatures of the respective areas A to I of the first and second temperature adjusting plates 321A, 321B by which the temperature of the mask substrate W becomes uniform when being carried to the X-Y state 420 of the writing chamber.

The heat exchanger 700 changes the temperatures of the cooling water supplied to the respective areas A to I of the first and second temperature adjusting plates 321A, 321B independently, based on the control from the control device 600.

The power supply 800 changes the power supplied to the respective areas A to I of the first and second temperature adjusting plates 321A, 321B independently, based on the control from the control device 600.

(Operation of Mask Drawing Apparatus 10)

Next, an operation of the mask drawing apparatus 10 will be described. Note that the operation of the mask drawing apparatus 10 described below is controlled by the control device 600.

First, the container C housing the mask substrate W is mounted on the mounting table 110. The carrier robot 120 retrieves the mask substrate W from the container C. Next, a pressure of the I/O chamber 200 is made an atmospheric pressure and the gate valve G1 is opened.

The carrier robot 120 retracts from the inside of the I/O chamber 200 after the mask substrate W is mounted inside the I/O chamber 200. Next, the gate valve G1 is closed. The gate valve G2 is opened after the inside of the I/O chamber is evacuated to a predetermined pressure.

Next, the carrier robot 340 retrieves the mask substrate W from the inside of the I/O chamber 200. Thereafter, the gate valve G2 is closed. Next, the carrier robot 340 carries the mask substrate W to the soaking chamber 320 and mounts the mask substrate W on the supporting member 322 provided between the first and second temperature adjusting plates 321A, 321B.

The control device 600 controls the temperatures of the cooling water supplied from the heat exchanger 700 to the soaking chamber 320 and the power supplied from the power supply 800 to the heater R so that the temperatures detected by the thermometers T provided in the respective regions A to I of the first and second temperature adjusting plates 321A, 321B become the temperature set (stored) in the memory 620 in advance.

The heat exchanger 700 changes the temperatures of the cooling water supplied to the respective areas A to I of the first and second temperature adjusting plates 321A, 321B independently, based on the control of the control device 600. Further, the power supply 800 changes the power supplied to the respective areas A to I of the first and second temperature adjusting plates 321A, 321B independently, based on the control from the control device 600.

When the temperatures of the respective areas A to I of the first and second temperature adjusting plates 321A, 321B become temperatures set (stored) in advance, the carrier robot 340 carries the mask substrate W to the alignment chamber 330.

In the alignment chamber 330, after alignment of the mask substrate W is carried out, the carrier robot 340 mounts the grounding body H housed in the alignment chamber 330 on the mask substrate W. Next, the gate valve G3 is opened. The carrier robot 340 mounts the mask substrate W on the X-Y stage 420 inside the R chamber 400. After the carrier robot 340 retracts from the inside of the R chamber 400, the gate valve G3 is closed.

The drive mechanisms 430A, 430B move the X-Y stage 420 to a predetermined position. Next, a charged particle beam is irradiated from the charged particle beam lens barrel 500 onto the mask substrate W, and a desired pattern is drawn.

When drawing to the mask substrate W is finished, the drive mechanisms 430A, 430B move the X-Y stage 420 to a predetermined position. Next, the gate valve G3 is opened. The carrier robot 340 retrieves the mask substrate W from the R chamber 400. Next, the gate valve G3 is closed. The carrier robot 340 carries the mask substrate W to the inside of alignment chamber 330, and the grounding body H is housed inside the alignment chamber 330 in a sequence reverse to that of the occasion where the grounding body H is mounted on the mask substrate W.

Next, the gate valve G2 is opened and the carrier robot 340, after mounting the mask substrate W inside the I/O chamber 200, retracts from the inside of the I/O chamber 200. Next, the gate valve G2 is closed. After vent gas is supplied from the gas supply series 220 and the inside of the I/O chamber 200 is raised to the atmospheric pressure, the gate valve G1 is opened.

The carrier robot 120 retrieves the mask substrate W from the inside of the I/O chamber 200 and retracts from the inside of the I/O chamber 200. Next, the gate valve G1 is closed. Next, the carrier robot 120 houses the mask substrate W into the container C.

As described above, the mask drawing apparatus 10 according to this embodiment has the first and second temperature adjusting plates 321A, 321B which are segmented into the plural regions capable of being independently temperature-adjusted and are disposed to face each other. Thus, it is possible to adjust the temperature of the mask substrate W in consideration of heat release from the support pin supporting the mask substrate W and the peripheral portion of the mask substrate W or heat release from the X-Y stage 420.

Consequently, it is possible to make the mask substrate W have the temperature gradient consciously at the time of adjusting the temperature in the soaking chamber 320, so that the temperature of the mask substrate W can be adjusted to be uniform when being carried to the X-Y stage 420 of the writing chamber 400.

Further, the respective regions A to I of the first and second temperature adjusting plates 321A, 321B are made to have the temperature gradients in correspondence with the pattern density of the mask substrate W or the irradiation amount of the charged particle beam corresponding to the respective regions A to I of the first and second temperature adjusting plates 321A, 321B. Thus, it is possible to suppress occurrence of a temperature gradient in the mask substrate W which is being subjected to drawing, due to irradiation of the charged particle beam.

Modification Example of Embodiment

Figure 4A:
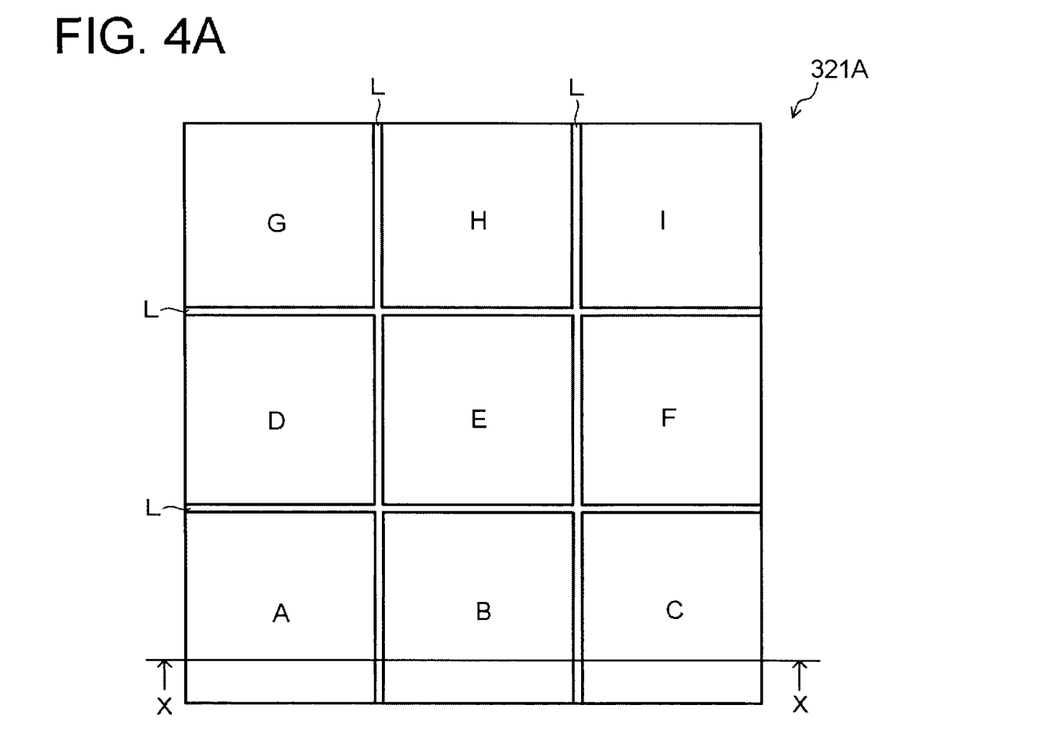
FIG. 4A and FIG. 4B are schematic diagrams of a temperature adjusting plate according to a modification example of the embodiment.
Figure 4B:
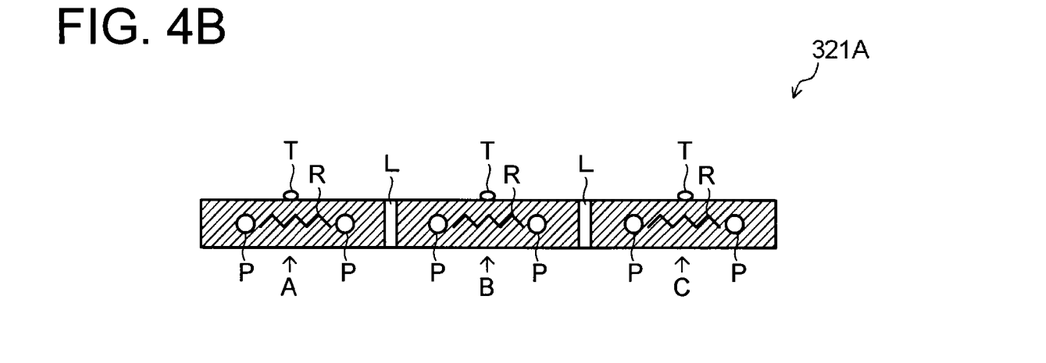

FIG. 4A and FIG. 4B are schematic diagrams of a first temperature adjusting plate 321A according to a modification example of the embodiment. FIG. 4A is a plan view of the first temperature adjusting plate 321A. FIG. 4B is a cross-sectional view taken along a line X-X in FIG. 4A. A configuration of a second temperature adjusting plate 321B is the same as a configuration of the first temperature adjusting plate 321A, and redundant explanation will be omitted.

In the temperature adjusting plate 321A according to the embodiment described with reference to FIG. 3A and FIG. 3B, the respective regions A to I are not physically segmented. However, as shown in FIG. 4A and FIG. 4B, respective regions A to I of the first temperature adjusting plate 321A can be configured to be segmented by a material L (for example, ceramics) which has a low thermal conductivity. As a result of segmenting the respective regions A to I by the material with the low thermal conductivity, it becomes easier to make the respective regions A to I have thermal gradients.

Further, in the mask drawing apparatus 10 described with reference to FIG. 1A and FIG. 1B, the grounding body H is housed in the alignment chamber 330, but a chamber housing a grounding body H can be provided separately from an alignment chamber. Further, it is possible to supply power directly from a control device 600 without providing a power supply 800.

Other Embodiments

While certain embodiments have been described, these embodiments have been presented by way of example only, and are not intended to limit the scope of the inventions. Indeed, the novel embodiment described herein may be embodiment in a variety of other forms; furthermore, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A temperature adjusting apparatus of a mask substrate used in a mask drawing apparatus drawing a desired pattern by irradiating a charged particle beam to a mask substrate after a temperature of the mask substrate is adjusted in advance, the temperature adjusting apparatus comprising:
a supporting member supporting the mask substrate; and
first and second temperature adjusting plates facing each other with sandwiching the supporting member, the plates having a plurality of first and second regions respectively, and each temperatures of the first and second regions being capable to be independently adjusted,
wherein a first distance from the first temperature adjusting plate to the mask substrate is approximately equal to a second distance from the second temperature adjusting plate to the mask substrate, and
wherein the first regions in the first temperature adjusting plate include at least one region which temperature is different from those of other regions among the first regions, the second regions in the second temperature adjusting plate include at least one region which temperature is different from those of other regions among the second regions.

2. The temperature adjusting apparatus of the mask substrate according to claim 1,
wherein the plurality of first and second regions face each other.

3. The temperature adjusting apparatus of the mask substrate according to claim 1, further comprising
a plurality of thermometers disposed in the plurality of first and second regions.

4. The temperature adjusting apparatus of the mask substrate according to claim 3,
wherein the temperature adjusting apparatus adjusts temperatures of the respective regions of the first and second temperature adjusting plates in correspondence with temperatures measured by the thermometers.

5. The temperature adjusting apparatus of the mask substrate according to claim 1, further comprising:
a memory storing a plurality of preset temperatures corresponding to the plurality of first and second regions,
wherein the temperature adjusting apparatus adjusts temperatures of the respective regions of the first and second temperature adjusting plates, based on the plurality of preset temperatures.

6. The temperature adjusting apparatus of the mask substrate according to claim 5,
wherein at least one of the plurality of preset temperatures is different from other preset temperatures.

7. A mask drawing apparatus comprising:
a first chamber;
a supporting member disposed in the first chamber and supporting a mask substrate;
first and second temperature adjusting plates disposed in the first chamber and facing each other with sandwiching the supporting member, the plates having a plurality of first and second regions respectively, and each temperatures of the first and second regions being capable to be independently adjusted;
a second chamber connected to the first chamber;
a carrier mechanism carrying the mask substrate from the first chamber to the second chamber; and
a drawing mechanism drawing a desired pattern by irradiating a charged particle beam to the mask substrate carried into the second chamber,
wherein a first distance from the first temperature adjusting plate to the mask substrate is approximately equal to a second distance from the second temperature adjusting plate to the mask substrate, and
wherein the first regions in the first temperature adjusting plate include at least one region which temperature is different from those of other regions among the first regions, the second regions in the second temperature adjusting plate include at least one region which temperature is different from those of other regions among the second regions.

8. The mask drawing apparatus according to claim 7,
wherein the plurality of first and second regions face each other.

9. The mask drawing apparatus according to claim 7, further comprising
a plurality of thermometers disposed in the plurality of first and second regions.

10. The mask drawing apparatus according to claim 9, further comprising a temperature adjusting mechanism adjusting the temperatures of the respective regions of the first and second temperature adjusting plates in correspondence with temperatures measured by the plurality of thermometers.

11. The mask drawing apparatus according to claim 10, further comprising
a memory storing a plurality of preset temperatures corresponding to the plurality of first and second regions,
wherein the temperature adjusting mechanism adjusts temperatures of the respective regions of the first and second temperature adjusting plates based on the plurality of preset temperatures.

12. The mask drawing apparatus according to claim 11, wherein at least one of the plurality of preset temperatures is different from the other preset temperatures.

13. The mask drawing apparatus according to claim 12, wherein the plurality of preset temperatures are set so that a temperature of the mask substrate at a time of drawing becomes uniform.

14. The mask drawing apparatus according to claim 11, further comprising:
a plurality of heaters disposed in the plurality of first and second regions; and
a power supply supplying power independently to the plurality of heaters,
wherein the temperature adjusting mechanism controls the power supply and adjusts the temperatures of the respective regions of the first and second temperature adjusting plates.

15. The mask drawing apparatus according to claim 11, further comprising
a heat exchanger supplying cooling water to the plurality of the first and second regions respectively, the temperatures of the cooling water being independently adjusted,
wherein the temperature adjusting mechanism controls the heat exchanger and adjusts the temperatures of the respective regions of the first and second temperature adjusting plates.

16. A mask drawing method comprising:
disposing a mask substrate between first and second temperature adjusting plates to adjust a temperature of the mask substrate, the plates having a plurality of first and second regions respectively, and each temperatures of the first and second regions being capable to be independently adjusted; and
drawing a desired pattern by irradiating a charged particle beam to the mask substrate having the adjusted temperature,
wherein a first distance from the first temperature adjusting plate to the mask substrate is approximately equal to a second distance from the second temperature adjusting plate to the mask substrate, and
wherein the first regions in the first temperature adjusting plate include at least one region which temperature is different from those of other regions among the first regions, the second regions in the second temperature adjusting plate include at least one region which temperature is different from those of other regions among the second regions.

17. The mask drawing method according to claim 16, wherein the plurality of first and second regions face each other.

18. The temperature adjusting apparatus of the mask substrate according to claim 1,
wherein the at least one region in the first temperature adjusting plate is disposed corresponding to the at least one region in the second temperature adjusting plate.

19. The mask drawing apparatus according to claim 7, wherein the at least one region in the first temperature adjusting plate is disposed corresponding to the at least one region in the second temperature adjusting plate.

20. The mask drawing method according to claim 16, wherein the at least one region in the first temperature adjusting plate is disposed corresponding to the at least one region in the second temperature adjusting plate.

21. The mask drawing apparatus according to claim 7, wherein the mask substrate has a plurality of third regions corresponding to the first regions of the first temperature adjusting plate and the second regions of the second temperature adjusting plate, and
wherein temperatures in the first regions of the first temperature adjusting plate and temperatures in the second regions of the second temperature adjusting plate correspond to pattern densities of the desired pattern in the third regions of the mask substrate.

22. The mask drawing apparatus according to claim 21, wherein the temperatures in the first regions of the first temperature adjusting plate and the temperatures in the second regions of the second temperature adjusting plate decrease with increases of the pattern densities in the third regions of the mask substrate.

* * * * *